United States Patent [19]  [11] 4,145,216
Merrill et al.  [45] Mar. 20, 1979

[54] DRY TRANSFER IMAGE SYSTEMS

[75] Inventors: Richard E. Merrill, Wakefield; Theodore H. Krueger, Wayland, both of Mass.

[73] Assignee: Seal Incorporated, Naugatuck, Conn.

[21] Appl. No.: 838,109

[22] Filed: Sep. 30, 1977

Related U.S. Application Data

[62] Division of Ser. No. 628,506, Nov. 3, 1975, Pat. No. 4,081,282.

[51] Int. Cl.² .................. G03C 5/00; G03C 11/12
[52] U.S. Cl. ..................................... 96/28; 96/35.1
[58] Field of Search ....................... 96/28, 35.1, 35

[56] References Cited

U.S. PATENT DOCUMENTS 3,615,435  10/1971  Chu et al. ............... 96/35.1
3,770,438  11/1973  Celeste .................. 96/67
3,813,218  5/1974   de Plasse ............... 96/67

Primary Examiner—Richard L. Schilling
Attorney, Agent, or Firm—Schiller & Pandiscio

[57] ABSTRACT

A dry system for forming and transferring images is provided. The system comprises a photoactive component comprising a tacky photohardenable layer on a selected carrier sheet and a transfer component comprising a frangible color layer on a selected carrier sheet. The two components are disposed with their photohardenable and color layers in air-free contact with one another and then subjected to irradiation with actinic radiation in accordance with a selected image pattern so as to cause selected portions of the photohardenable layer to harden and fuse to confronting portions of the color layer. Then the two components are separated whereby the fused portions of the color layer are separated from its carrier sheet and transferred to the photoactive component. Thereafter the color layer remaining on the transferable component is coated with a pressure-sensitive adhesive. Finally, the transferable component is positioned with its adhesive coating engaging a receptor substrate and the rear side of its carrier sheet is rubbed hard or burnished with a suitable implement so as to cause the remaining image-defining portions of the color layer to separate from its carrier sheet and adhere to the receptor substrate.

20 Claims, 8 Drawing Figures

DRY TRANSFER IMAGE SYSTEMS

This application is a division of application Ser. No. 628,506, filed Nov. 3, 1975, now U.S. Pat. No. 4,081,282.

This invention relates to transfer imaging systems and more particularly to a new method and materials for forming transferable images.

One primary object of this invention is to provide a new and versatile system for rapidly producing transferable images without the need for expensive and complex specialized equipment. Another primary object is to provide a transfer imaging system for use in the graphic arts field which is capable of inexpensively producing letters or numerals in a wide variety of colors, sizes and styles that can be transferred to a selected substrate. A further primary object is to provide a versatile transfer imaging system which enables the user to selectively vary the color, style and size of the transferable images which are produced.

A more specific object is to provide a system for forming transferable images based on the selective adhesion of images made by exposing a photoactive layer to light through a selected master.

Another specific object is to provide a method and materials for forming transferable images where the size and form of the image is determined by exposure of a photoactive layer to light through an appropriate positive or negative master and the color of the image is determined by use of an appropriate image-transferring color sheet in contact with the photoactive layer.

The foregoing objects are achieved by a system which comprises two basic components: (1) a photoactive component in the form of a transparent carrier film with a photoactive coating which is photopolymerizable or photohardenable; and (2) a transferable component in the form of a carrier film with a frangible, transferable layer which may contain a colorant. The two components are placed together as a sandwich so that the photoactive coating contacts the frangible coating. The transferable images are formed by (A) exposing the dual component sandwich to light via a suitable image-defining mask whereby selected portions of the photoactive coating photopolymerize and form a relatively strong bond with confronting portions of the frangible layer and (B) separating the two components whereby each portion of the frangible layer confronting an illuminated portion of the photoactive coating pulls away from its carrier film due to adhesion with the photopolymerized portion of the photoactive coating. The portion of the frangible layer remaining on its carrier sheet defines the transferable image which is thereafter released and transferred to a selected substrate, e.g. to art work.

Other features and many of the attendant advantages of the invention are disclosed in the following detailed description which sets forth a preferred embodiment and is to be considered together with the accompanying drawing wherein.

In the several views like numerals and letters identify like parts, unless otherwise indicated.

Figure 1:
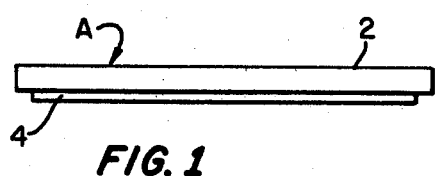
FIGS. 1 and 2 illustrate the photoactive and transferable components respectively.

Referring now to FIG. 1, the photoactive component A essentially comprises a clear optically transmissive carrier sheet or film 2 which has been overcoated on one side with a layer of photopolymerizable or photohardenable composition 4.

The terms photopolymerizable and "photohardenable" are used herein to refer to systems in which the molecular weight of at least one component of the photoactive layer or coating is increased by exposure to actinic radiation and where the proportional amount of such component is sufficient for the radiation-induced increase in its molecular weight to cause a change in the rheological and thermal behavior of the exposed areas of the coating. Among suitable photopolymerizable systems which may form the photoactive coating in whole or in part are: (1) those in which a photopolymerizable monomer is present alone or in combination with a suitable binder or (2) those in which a photopolymerizable group, e.g. a vinyl monomer, is attached to a polymer backbone and which on exposure to radiation will crosslink by reaction with a similar group or other reactive sites on adjacent polymer chains. The second group of photopolymerizable systems may or may not include a compatible binder. In both groups of photopolymerizable systems the compatible binder may but need not be a polymer. The photopolymerizable component may be inherently light sensitive or it may be sensitized for photopolymerization by including a photo-initiator or sensitizer in the photoactive composition. In any event the photoactive layer is made so that it is tacky and can adhere to the transferable component B described hereinafter. Typically, the tackiness of the photoactive layer 4 is achieved by depositing the photopolymerizable composition onto the film 2 from a solution in a volatile solvent.

Preferably, the photoactive layer has a thickness of about 0.010 inch, but satisfactory results also may be achieved if the photoactive layer has a thickness as little as about 0.005 inch, or as great as about 0.025 inch. The film 2 has preferably a thickness in the range from about 0.001 to about 0.020 inch. However, other thicknesses also may be used. The photoactive layer 4 may but need not have some capability of transmitting light (including the light used to activate it) since the system does not require the transferable component to absorb or be activated by light energy. Preferably, however, the photoactive layer has a relatively low transmittance for light of the frequency required to activate the photopolymerizable component and a relatively high transmittance for light of all other frequencies. In the preferred embodiment of the invention, the carrier sheet 2 may be a polyethylene terephthalate, e.g. of the type made and sold by E. I. duPont de Nemeurs Company under the trademark "MYLAR" and the photoactive composition 4 comprises a mixture of an acrylic monomer and an acrylic polymer as a binder for the monomer, with the monomer sensitized for photo-polymerization by a photo-initiator such as phenanthrene quinone.

The transferable component B essentially comprises a carrier sheet or film 6 which is overcoated on one side with a substantially uniform and normally stable but frangible transferable layer 8. The sheet 6 may but need not be transparent to visible light and/or light of the frequency required to activate layer 4 and may be a film such as is used as the carrier sheet for the photoactive component A. Carrier sheet 6 preferably has a thickness in the range of about 0.001 to about 0.030 inch.

The frangible, transferable layer 8 preferably is formed with a thickness of about 0.005 inch, but the thickness could be smaller or greater. Preferably its thickness is not less than about 0.0005 and not greater than about 0.010 inch. The frangible layer 8 may be of widely different compositions, but preferably it comprises one or more polymer or polymeric binders in admixture with one or more waxes. Additionally, the layer 8 may include a solid or liquid plasticizer, a pigment or dye to impart color if the layer otherwise would be colorless or of undesired color, and an opacifier if needed. Still other ingredients such as a temperature stabilizing agent may be included in the frangible layer.

In the preferred embodiment of the invention the carrier sheet 6 is clear transparent polyethylene terephthalate film and the frangible layer 8 has a composition as shown in composition 7 of Table II.

Figure 3:
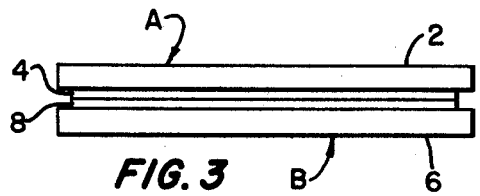
FIG. 3 illustrates how the components of FIGS. 1 and 2 are laminated together to form an integrated sandwich structure.

Referring now to FIG. 3, the photoactive component A and the transferable component B are preformed and then are brought together so that the tacky photoactive layer 4 intimately engages and holds onto the frangible layer 8. This is achieved by subjecting the mutually engaging sheets to a pressure which is substantially uniform along their entire areas. Preferably, the two sheets are laminated together by compressing them between a pair of platens or by passing them between a pair of pressure rollers.

Figure 4B:
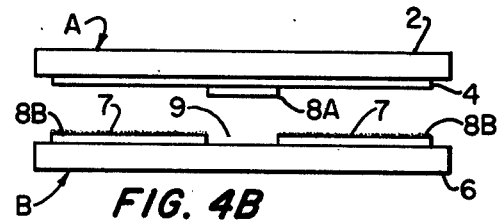
FIGS. 4A-4E illustrate how a transferable image is formed and transferred using the sandwich structure of FIG. 3.
Figure 2:
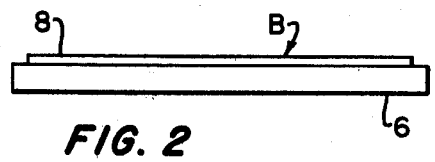
Figure 4C:
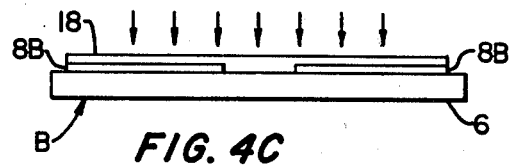
Figure 4D:
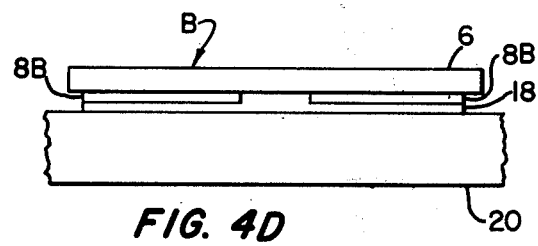
Figure 4A:
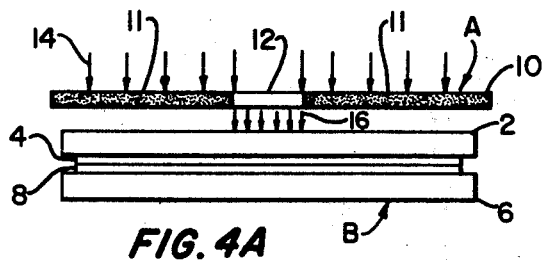

The formation and transfer of an image using the dual component sandwich of FIG. 3 is achieved in accordance with the procedure illustrated in FIGS. 4A–4E. A mask 10 which is formed with opaque and transparent areas 11 and 12 respectively so as to define a predetermined positive or negative master image is disposed between the sheets and a selected light source (not shown) which is arranged to uniformly illuminate the mask with actinic light. In FIG. 4A the illuminating radiation is represented schematically by the arrows 14. The indirect light energy is blocked by the opaque areas 11 of the mask and transmitted by the transparent areas 12 of the mask. In FIG. 4A, the arrows 16 represent the light energy which is passed by the transparent areas of the mask and impinges on the transparent substrate 2 of the photoactive component A. The light passes through the transparent carrier sheet 2 into the photoactive composition 4, with the area of the latter composition which is subjected to light conforming in configuration to the area 12 of the mask which is transparent to the light energy. The sandwich is illuminated for a period of time sufficient to cause the irradiated photopolymerizable component(s) in the layer 4 to undergo photopolymerization. The irradiated photopolymerizable component is converted to a substantially hard, non-tacky polymer which is securely bonded to the adjacent portion of the frangible layer 8. The remaining area of the photoactive composition 4 remains tacky due to the fact that its photopolymerizable component remains unchanged.

Thereafter, as shown in FIG. 4B, the photoactive component A is pulled away from the transferable component B. When this occurs, that portion of the transferable layer 8 which was in confronting relation with the portion of the photoactive composition 4 which underwent photopolymerization, is pulled away from the carrier sheet 6 as a discrete section 8A which is joined to the photoactive composition 4. The portion 8A breaks away from the remaining portion of the transferable layer 8 so as to leave a cavity 9 in the frangible layer 8 which conforms in configuration to the configuration of the transparent portion 12 of mask 10. At this point the sections 8B of the frangible layer 8 which remain attached to the carrier sheet 6 define a positive image of the opaque areas of mask 10. A further significant feature is that the portion of the photoactive layer 4 which was not exposed to light tends to separate from itself and adhere to the layer 8 when the photoactive component A and the transferable component B are separated from one another so that a thin tacky film 7 of the photoactive layer 4 overlies the sections 8B of layer 8.

Figure 4E:
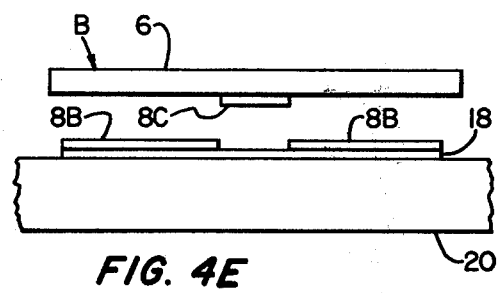

Following separation of the components A and B, a thin layer 18 of the translucent or transparent pressure-sensitive adhesive is applied over the image-defining sections 8B remaining on the carrier sheet 6 as shown in FIG. 4C. This adhesive layer preferably consists of one or more waxes of suitable consistency and may be applied from a solution thereof in a volatile solvent or as molten layer. The adhesive layer 18 may be applied by spraying, dipping, roller-coating or other suitable technique known to persons skilled in the art. Next, as shown in FIG. 4C, the transferable component B is exposed to actinic radiation (represented by arrows 19) so as to photopolymerize and set the unreacted tacky photoactive material 7 on the image-defining sections 8B. The resulting product is then ready for use. Accordingly, as shown in FIG. 4D, the adhesive composition 18 on the color layer 8 is brought into contact with an image receptor or image-receiving substrate 20 and pressed against the latter hard enough for the adhesive to adhere to the substrate. Transfer of selected images, e.g. selected ones of formed letters or numerals, may be effected by rubbing the rear side of carrier sheet 6 with a suitable tool in the manner described in U.S. Pat. No. 3,013,917. Thereafter, as seen in FIG. 4E, the carrier sheet 6 is peeled away from the substrate and, as this occurs, the transferable layer sections 8B transfer onto the substrate 20 as a result of adhesion of adhesive layer 18. The portions of the adhesive composition 18 which do not overlie the image-defining sections 8B tend to remain attached to the carrier sheet 6, after the latter is pulled away from the substrate 20, as illustrated at 8C. However, if the adhesive is clear or translucent, it is immaterial whether or not the portions 8C end up on the carrier sheet 6 or substrate 20.

The following requirements must be met for satisfactory image formation and image transfer:
 (1) The illuminating radiation must comprise radiation in the activating wavelength band of the photopolymerizable component, i.e. the radiation must be actinic;
 (2) The adhesion between the photopolymer (i.e. the polymer produced by photochemical reaction) and its carrier film must be equal to or greater than the adhesion between the frangible layer and its own carrier film;
 (3) The adhesion between the frangible layer and its carrier film should be less than the bond formed between the frangible layer and the photopolymer;
 (4) The bond formed between the adhesive coating and the frangible layer and the bond formed between the adhesive coating and the substrate or artwork to which transfer is to be made must be greater than the adhesion between the frangible layer and its carrier film; and (5) When components A and B are separated, the frangible layer must pull away completely from its carrier sheet in those areas where it confronts the photopolymer.

As used herein, the term "frangible coating" or "frangible layer" describes a coating or layer which is mechanically disruptable into portions of selected size that are separable from contiguous portions along sharply and clearly defined lines.

The selective adhesion which is required to leave a transferable image on the carrier sheet 6 is controlled by the compositions of the photoactive component A and the frangible transferable component B, and the degree of irradiation by actinic light. As used herein, the terms "actinic light" and "actinic radiation" means light or radiation which comprises or consists of energy at wave-lengths at which the energy is capable of initiating a photochemical polymerization reaction. Since most of the photopolymerizable materials preferred for this invention generally exhibit their maximum sensitivity in the near-ultraviolet region, the light source should furnish an effective amount of such radiation. The mask through which the photoactive component A is exposed may be a line or half-tone negative or positive trnasparency and the positive or negative image or images defined by the mask may be letters, numbers, punctuation marks, or other designs.

The sheet 2 is preferably transparent but it may be translucent provided its light transmitting power is sufficiently great to permit the photoactive layer to be irradiated with a sharp image and intensely enough to photopolymerize. A number of different materials may be used as the carrier sheet 2 of the photoactive component A. By way of example but not limitation, the carrier sheet 2 also may be made of materials from the following list: cellophane, coated cellophane, cellulose acetate butyrate, cellulose acetate, polyvinyl chloride, polyvinyl acetate, polystyrene, polymers of $C_2$ to $C_4$ mono-olefins (polyethylene, polypropylene, etc.), and copolymers thereof, e.g. polyvinyl acetate/chloride. Other materials that may be used may be selected from the carrier sheets listed in U.S. Pat. No. 3,432,376.

A number of different materials also can be used as the carrier sheet 6 of the transferable component B. Thus, by way of example but not limitation, the materials mentioned above as suitable for the carrier sheet 2 may also be used for the carrier sheet 6. Since it need not be transparent, colored cellulose acetate or colored Mylar ® may be used as the carrier sheet 6 for component B. By way of further example, carrier sheet 6 also may be made of paper, polyvinyl acetate, vinylidene chloride, metal foil, glassine or glass. Still other materials that may be used for carrier sheet 6 may be selected from the carrier sheet materials listed in U.S. Pat. No. 3,510,385.

The photoactive coating preferably comprises a mixture of poly n-butyl methacrylate polymer as a binder and 1,3-butylene glycol dimethacrylate monomer as the photohardenable material, with phenanthrene quinone as the photocatalyst or photo-initiator. However, other materials may be used in their stead. Thus, for example, the foregoing polymer constitutuent may be replaced by poly methyl methacrylate or poly ethyl acrylate while the monomer may be replaced by ethylene glycol dimethylacrylate or diethylene glycol diacrylate. Further, by way of example, benzoin, benzoin ethers, Michelers ketone, and benzophenone may be used in place of phenanthrene quinone. For further descriptions of photohardenable materials and compatible binders and photocatalysts (i.e. photosensitizors or photo-initiators) that may be used therewith, reference is made to U.S. Pat. Nos. 3,649,268, 3,620,726 and 3,615,435. Still other polymers, photoactive monomers and photocatalysts known to persons skilled in the art may be used in practicing this invention.

For the purpose of this invention the photoactive coating should be formulated as follows on a weight percent basis:

| | |
|---|---|
| Photoactive monomer (or polymer with pendant photopolymerizable group) | 20–60% |
| Polymer binder | 40–80% |
| Photo-initiator | as required |

Preferably, but not necessarily, the photo-initiator does not exceed about 3.0% by weight and constitutes between about 0.2% and 3.0% of the photoactive coating.

The photoactive coating preferably is formed by depositing the foregoing mixture from solution in a suitable solvent. Accordingly, the foregoing mixture is combined with an amount of a volatile solvent such as methylene chloride which is sufficient to effect dissolution and form a spreadable liquid. Typically the liquid comprises enough solvent to form a 20–40% total solids solution. The liquid is coated onto the carrier sheet as a uniform film, whereupon the solvent evaporates and leaves a tacky photoactive coating on the carrier sheet.

Table I illustrates a number of formulations on a weight percent basis which have been devised to form photoactive components according to this invention. In each case the photoactive layer was deposited from solution onto a clear transparent carrier sheet made of polyethylene terephthalate and having a thickness of 0.001 inch.

TABLE I

| Component | Formulation No. | | | | | | | | |
|---|---|---|---|---|---|---|---|---|---|
| | 1 | 2 | 5 | 7 | 10 | 13 | 14 | 17 | 26 |
| Poly n-butyl-methacrylate resin (Elvacite 2044) | 10.8 | 10.8 | 13.1 | 10.8 | 10.8 | 22.1 | 17.5 | 10.6 | — |
| 1,3 Butylene glycol dimethacrylate (SR-297) | 8.1 | 8.1 | 7.9 | 8.1 | 8.1 | 8.3 | 8.1 | 8.0 | 8.1 |
| pyrogenic colloidal silica (Cab-O-Sil M5) | — | 0.3 | — | — | — | — | — | 1.3 | — |
| Phenanthrene quinone | 0.3 | 0.3 | 0.3 | — | — | — | — | — | — |
| Benzoin isopropyl ether | — | — | — | 0.3 | — | — | — | — | — |

TABLE I-continued

| Component | Formulation No. | | | | | | | | |
|---|---|---|---|---|---|---|---|---|---|
| | 1 | 2 | 5 | 7 | 10 | 13 | 14 | 17 | 26 |
| Benzoin iso-butyl ether (Vicure 10) | — | — | — | — | 0.3 | 0.3 | 0.3 | 0.3 | — |
| Acrylic resin (Carboset 525) | — | — | — | — | — | — | — | — | 10.8 |
| Methylene chloride | 80.8 | 80.5 | 78.7 | 80.8 | 80.8 | — | 74.1 | 79.8 | 80.8 |
| Total | 100.0 | 100.0 | 100.0 | 100.0 | 100.0 | 100.0 | 100.0 | 100.0 | 100.0 |

Elvacite 2044 is a product of E.I. DuPont de Nemeurs Co., Polymer Products Division).
SR-297 is a product of Sartomer Co.
Cab-O-Sil M5 is a product of Cabot Corporation.
Vicure 10 is a product of Stauffer Chemical Co.
Carboset 525 is a product of B.F. Goodrich Chemical Co., and is believed to be an acrylic polymer with an average molecular weight of about 260,000.

The essential requirement of the coating 8 is that it be flexible and comply with the above-described requirements for satisfactory image formation and transfer. The coating 8 preferably consists of a mixture of one or more thermoplastic film-forming binders and one or more synthetic or natural waxes, but it may comprise other components instead.

The frangible layer of the transferable component B may have inherent opacity or color which is adequate for the purposes of the invention. If it does not, an opacifying agent or colorant is added to it to assure that the image which is produced and transferred is of suitable quality. A suitable solid or liquid plasticizer also may be added to control the disruptability of the coating. In the preferred types of flexible coatings, the amounts of film-forming binders and waxes (which will vary according to the specific binders and waxes employed and whether or not plasticizers or fillers are used) are controlled so as to impart the desired strength, flexibility, disruptability and adhesiveness to the color coat. Animal, vegetable and mineral waxes and waxy materials may be used in forming the flexible coating 8, including but not limited to microcrystalline wax, spermaceti wax, carnauba wax, beeswax, castor wax, polythene wax, candelilla wax, monton wax, petroleum waxes, paraffin waxes, paraffinic-naphthenic waxes, polyethylene waxes, Fischer-Tropsch waxes, fatty acids and their derivatives such as fatty acid esters of polyols such as polyethylene glycols and polypropylene glycols and fatty alcohol ethers of polyols such as polyethylene glycols and polypropylene glycols, and mixtures thereof. In addition to nitrocellulose, among the film-forming resins that may be used as the binder component of the frangible layer 8 are ethyl cellulose, cellulose acetate-butyrate, polyvinyl acetate, polystyrene, acrylonitrile-butadiene copolymer, styrene-butadiene copolymer, acrylic resins such as methyl methacrylate and ethyl acrylate, ethyl methacrylate, propyl methacrylate, and butyl methacrylate, polychloroprene rubbers, polyvinyl butyral, and also copolymers and mixtures thereof. The relative proportions of wax and binder may vary within relatively wide limits depending upon the exact materials used. Various plasticizers and solvents known to persons skilled in the art also may be used in frangible layer 8. By way of example but not limitation, the coating 8 may include one or more of the ester-type plasticizers listed in U.S. Pat. No. 3,645,204.

A variety of particulate or dye-type colorants may be used in formulating the transferable frangible coating. The colorants may be pigments, dyes, or lakes. By way of example, one or more of the following pigments may be used: zinc yellow, bronze and iron blue, brown red haematite, red lake C, and carbon black. Still other colorants are C.I. Vat Yellow 1, C.I. Pigment Red 122, C.I. Pigment Blue, C.I. Pigment Black 1 and C.I. Pigment Yellow 12. See also the colorants specified in U.S. Pat. Nos. 3,615,435 and 3,620,726. Instead of or in addition to a colorant, other materials also may be incorporated into the frangible layer, e.g. glass beads, magnetic materials such as magnetic iron and chromium oxides, and electric or heat conducting and hydrophobic or hydrophilic materials.

The ingredients which make up the frangible layer are coated onto the carrier sheet 6 from a solution in a suitable volatile solvent. The solvents that may be used may be selected (in accordance with the binder employed) from the following group: methyl ethyl ketone, toluene, methyl isobutyl ketone, xylene, methanol, ethyl alcohol, heptane, ethyl acetate, butyl acetate, methylene chloride, methylene dichloride, dichloroethyl ether, trichloroethylene and benzene (the selected solvent for the binder may also serve as a solvent for the wax or waxy component of layer 6). Preferably the layer is coated on the carrier sheet from a 20–30% by weight total solids solution.

Tables II, III and IV illustrate various color coat formulations (on a weight percent basis) used to form the transferable component B. Table II shows typical formulations based on nitricellulose which have been used to coat a polyethylene terephthalate carrier sheet with a thickness of 0.001 inch, Table III shows typical formulations of coatings based on an alcohol soluble butyrate which have been used to coat a polyethylene terephthalate carrier sheet with a thickness of 0.001 inch, and Table IV shows typical coatings based on polyvinyl butyral which have been used to coat a polyethylene terephthalate carrier sheet measuring 0.001 inch thick. In each case the uncoated carrier sheet was clear and transparent. The abbreviations G and E stand for "good" and "excellent" respectively. The designation "P.A." followed by a numeral identifies one of the photoactive compositions of Table I.

The image quality of the color coats of Tables II and IV were determined with respect to photoactive components using photoactive layer Formulation No. 7 of Table I.

TABLE II

| Component | Formulation No. | | | | |
|---|---|---|---|---|---|
| | 7 | 10 | 11 | 12 | 13 |
| Nitrocellose, RS ½ sec., viscosity 4.7 | 18.4 | 18.4 | 18.4 | 18.4 | 18.4 |
| Glycowax | 9.5 | 14.0 | 21.0 | 19.8 | 11.7 |

TABLE II-continued

| Component | Formulation No. | | | | |
|---|---|---|---|---|---|
| | 7 | 10 | 11 | 12 | 13 |
| S-932 | | | | | |
| Flexowax C | 4.7 | — | — | — | — |
| Castor Oil AA, USP | 6.7 | 7.0 | — | — | 7.0 |
| Paracin 9 | — | — | — | 1.2 | 2.3 |
| Color Pigment | 47.2* | 47.2* | 47.2** | 47.2** | 47.2** |
| Titanium Dioxide | 13.5 | 13.4 | 13.4 | 13.4 | 13.4 |
| Total Solids | 100.0 | 100.0 | 100.0 | 100.0 | 100.0 |
| Solvent*** | 316 | 316 | 316 | 316 | 316 |
| Solvent as % of total solids | 24.0 | 24.0 | 24.0 | 24.0 | 24.0 |
| Image Definition | G | G | G | G | G |
| Overall Quality of Image | G | G | G | G | E |
| Completeness of Letters Transfer | 100% | 100% | 100% | 100% | 100% |
| completeness of Letters Background Retention | 75%+ | 75%+ | 50%+ | 75%+ | 95%+ |

*Monastral Blue BF (duPont)
**Mapico Red 297 (Columbian Carbon)
***The solvent comprised by weight 3 parts toluene, 2 parts butyl acetate and 1 part ethyl acetate.

TABLE III

| Component | Formulation No. | | |
|---|---|---|---|
| | 23 | 24 | 42 |
| ASB | 18.5 | 10.2 | 7.8 |
| ZKMA 0251 | 74.1 | 81.6 | 30.8 |
| Ketone Resin Polyglycol E 1000 | — | — | 23.0 |
| Pigment | 7.4 | 8.2 | 26.9 |
| Titanium Dioxide | — | — | 11.5 |
| Total Solids | 100.0 | 100.0 | 100.0 |
| Solvent* | 259 | 286 | 231 |
| Solvent % of total solids | 27.9 | 25.9 | 30.2 |
| Quality of Image as compared to: | | | |
| P.A. 10 | G− | G+ | — |
| P.A. 7 | — | — | G |
| P.A. 17 | — | — | E |

*The solvent was ethanol (200P).

TABLE IV

| Component | Formulation No. | |
|---|---|---|
| | 23A | 24A |
| Butvar (B-76-1) | 4.5 | — |
| Beckacite 43-111 | 44.7 | 46.7 |
| Stearic Acid | — | 0.1 |
| Color Pigment* | 25.4 | 26.6 |
| Titanium Dioxide | 25.4 | 26.6 |
| Total Solids | 100.0 | 100.0 |
| Solvent** | 402.0 | 421.0 |
| Solvent as % of solids | 19.9% | 19.2% |
| Definition of Image | G | G |
| Overall Quality of Image | G | E |
| Completeness of letters transfer | 100% | 100% |
| Completeness of background retention | 95%+ | 100% |

*Mapico Red 297
**The solvent was methylethyl ketone.

Glycowax S-932 is a wax product of Glyco Products, Co.; Flexowax C is a wax product of Glyco Products, Co.; Paracin 9 is a wax product of Baker Caster Oil Co.; ASB is a commercially available Eastman Chemical Co., alcohol soluble butyrate resin; ZKMA 0251 is a product of Union Carbide Co.; Polyglycol E 100 is a plasticizer material made by Dow Chemical Co.; Butvar (B-76-1) identifies a polyvinyl butyral-resin made by Monsanto Co.; and Beckacite 43-111 is a maleic modified rosin ester.

The adhesive composition 18 preferably is formulated so that its adherence to the substrate 20 to which the formed images are transferred is not so great as to prevent the transferred images from being peeled off of or erased from the substrate. While a heat or solvent activated adhesive may be used, it is preferred that the adhesive coating 18 be of the pressure sensitive variety. Also in the preferred mode of practicing the invention, it is preferred that the adhesive coating be clear or translucent and colorless or white, so that the sharpness of the transferred images will not be reduced by the appearance of any of the adhesive which transfers to the substrate 20 close to but outside of the edge boundaries of the images. It has been determined that adhesives are available which satisfy the needs of this invention. Two commercially available pressure-sensitive adhesive wax compositions which have been used with equal success in the practice of this invention are BB9 adhesive produced by Daige Products, Inc., and ARTWAX® available from Portage Products, Inc. Still other suitable pressure-sensitive wax compositions are known to persons skilled in the art. The adhesive composition may be of the type that comprises one or more waxes and an elastomer binder proportioned so as to achieve the desired adhesive properties, but other adhesive compositions also may be used. The adhesive preferably is applied as a hot melt but it may be dissolved in a suitable volatile solvent and applied as a liquid coating. A preferred adhesive composition which can be applied as a hot melt comprises a mixture of a wax or waxes and a natural or synthetic elastomer with the weight ratio of wax to elastomer being in the range of from about 95/5 to about 85/15. By way of example, the wax may be microcrystalline wax, and the elastomer may be polyisobutylene. The same adhesive may be dissolved in a volatile solvent such as naphtha so that it can be applied as a liquid at room temperature. The adhesive may also include a tackifying resin and/or a plasticizer. By way of example, the elastomer also may be a member of the group consisting of (a) natural rubber, (b) a synthetic rubber from the class consisting of styrene-butadiene copolymers, butadiene-acrylonitrile copolymer, polychloroprene and polyisoprene, and (c) other polymers and copolymers known to persons skilled in the art (see U.S. Pat. No. 3,623,944, column 8, lines 21–29). Other pressure sensitive adhesives which persons skilled in the art may recognize as suitable for use in the practice of this invention are disclosed by U.S. Pat. Nos. 3,472,719, 3,532,574, 3,276,933, 3,013,917, 3,519,456 and 3,510,385. Persons skilled in the art also will appreciate that available formulations of pressure-sensitive adhesives may be required to be adjusted, e.g. by dilution, in order to achieve the degree of adhesion, fluidity and tackiness required for this invention. As is believed obvious, many of the waxes or waxy-materials, resin binders and solvents employed in formulating the color coat 8 also may be used in formulating the adhesive 18.

The reason for irradiating the transferable component B after it is coated with the adhesive coating 18 is that the photohardenable component is usually anaerobic, i.e. it will harden under the influence of actinic radiation only if it is not exposed to air. The latter condition is achieved by applying the adhesive composition over the frangible coating after it is separated from the photoactive component A.

As noted above, the frangible layer 8 need not combine a binder and a wax but instead may have some other composition. By way of example, the frangible layer may consist by weight of 14.6% shellac, 7.2% ½ sec. nitrocellulose, 39.1% calcium carbonate, and 39.1% titanium dioxide, applied as a 20% solids solution in a mixture of methanol and methyl ethyl ketone. As a further example, the frangible layer 8 may consist of 15 wt% Acryloid B-44 acrylic resin (a product of Rohm & Haas Co.) and 85 wt.% calcium carbonate and titanium dioxide in a 9:1 ratio, applied as a 20% solids solution in toluene. The calcium carbonate and titanium dioxide serve to impart color to the coatings; also due to their high concentration, they help make the layer 8 frangible. Frangible layers made with the foregoing compositions may be applied to sheet materials of the type described above with respect to the carrier sheet 6, and transferable components embodying such layers are effective in producing and transferring images as provided by this invention. Still other compositions may be used in producing frangible layers suitable for the purposes of this invention.

Suitable sources of energy in the ultra-violet and near-ultra-violet regions of the spectrum are well known in the art, as disclosed by U.S. Pat. No. 3,639,123. In the practice of this invention a preferred exposure apparatus is Nu Arc carbon arc light source model SPN 20A, which uses a Natural High Intensity Photo 76, Catalog No. L8593, carbon arc available from Union Carbide Corporation, Carbon Products Division. Exposure times of 2 minutes with the photoactive component located 10 inches from the face of the carbon arc light source have been found to give consistently good images, but satisfactory results also have been achieved at the same distance with exposure times ranging from 15 seconds to four minutes.

As a modification of the invention, it is contemplated that the transferable component carrier sheet 6 may be coated with a release layer disposed between it and the frangible coat 8 to facilitate separation of the formed images 8B to the substrate 20. The release layer may be heat sensitive as contemplated by U.S. Pat. Nos. 3,516,842 and 3,340,121, but preferably only where the adhesive 18 is of the heat-activated variety. Alternatively the release layer may comprise a dry release coating of a selected silicone or quilon, as disclosed by U.S. Pat. No. 3,635,746.

Another modification of the invention consists of not initially combining the photoactive component A with the transferable component B, but instead covering the tacky photoactive coating 4 with a suitable release paper or film that will not adhere or else will only adhere lightly to the tacky coating. This enables the photoactive component to be packaged and shipped separately from the component and enables the user to selectively combine the photoactive component with transferable components of different colors.

A further modification of this invention is not to apply the adhesive coating 18 to the transferable component B until after the latter has been irradiated to harden the thin film of photohardenable material which adhered to it on its separation from the photoactive component A. Instead of separated component B may be covered with a suitable release sheet which isolates it from the air and also will not bond to the residual photoactive film when the color component B is irradiated for the second time. The release sheet may be retained with the component B to protect the latter until it is desired to transfer the formed letters, at which time the release sheet is peeled away, a suitable adhesive is coated over the formed image sections 8B of the transferable component, and the formed image sections are transferred to a suitable substrate by rubbing the rear side of the carrier sheet with a suitable implement as described above.

Still another modification involves transferring the image defining sections 8B remaining on the carrier sheet 6 to a receptor surface or substrate without having to apply an adhesive to either the substrate or the image defining portions 8B remaining on the carrier sheet material. This modification involves transferring the formed images to a light transmitting substrate or receptor member, e.g., a transparent plastic sheet. This modification comprises carrying out the steps illustrated in FIGS. 4A and 4B, after which the transferable component B carrying the formed images 8B is laid up against the transparent substrate and actinic radiation is directed through the transparent substrate at the image defining sections 8B, such that the thin film 7 of tacky unreacted photo-active materials adheres to the receptor surface and polymerizes to form a strong adherent bond with the receptive surface. Thereafter the substrate or carrier sheet 6 is stripped away, leaving the formed images 8B attached to the transparent substrate. This modification is suitable for forming signs. The receptor substrate may be translucent and/or colored, the only requirement being that it be capable of transmitting actinic radiation.

Still other modifications will be obvious to persons skilled in the art.

What is claimed is:

1. A method of forming and transferring images comprising providing a photoactive component and a transferable component, said photoactive component comprising a first carrier sheet coated with a layer of a tacky and unexposed photopolymerizable material, said transferable component comprising a layer of an opaque or colored frangible, non-photopolymerizable transferable material on a second carrier sheet, said photoactive and transferable components being disposed so that their photopolymerizable and transferable layers are in contact with one another, irradiating said layer of photopolymerizable material by directing actinic radiation through said first carrier sheet in accordance with a selected image pattern so as to cause selected portions of said photopolymerizable material to harden and bond to confronting portions of said layer of transferable material, separating said components so that only the bonded confronting portions of said layer of transferable material separate from said second carrier sheet, and transferring at least selected portions of the transferable material remaining on said second carrier sheet to a selected receptor substrate.

2. The method of claim 1 wherein said first carrier sheet is transparent.

3. The method of claim 1 wherein said first carrier sheet is translucent.

4. The method of claim 1 wherein said photopolymerizable material comprises a photopolymerizable monomer.

5. The method of claim 4 wherein said layer of frangible transferable material comprises at least one wax and at least one polymer binder.

6. The method of claim 4 wherein said transferable material comprises a wax and an organic binder.

7. The method of claim 6 wherein said transferable material includes a colorant.

8. A method of forming and transferring images comprising:
providing a photo-active component and a transferable component, said photo-active component comprising a first carrier sheet coated with a tacky layer of an unexposed photopolymerizable material and said transferable component comprising a layer of a frangible, non-photopolymerizable transferable material on a second carrier sheet, said components being disposed so that said photopolymerizable and transferable layers confront and are in contact with one another, irradiating said layer of photopolymerizable material so as to cause selected portions of said photopolymerizable material to harden and bond to selected confrontin portions of said layer of said transferable material, and separating said components so that the selected confronting portions of said layer of transferable material separate from said second carrier sheet and the rest of said layer of transferable material remains on said second carrier sheet.

9. The method of claim 8 wherein a thin film of said photopolymerizable material adheres to said layer of transferable material on said second carrier sheet in areas other than the area of said selected confronting portions when said components are separated.

10. The method of claim 9 further including engaging a selected receptor surface with those portions of said transferable material remaining on said second carrier sheet after separation of said components, and transferring said remaining portions to said selected receptor surface from said second carrier sheet.

11. A process according to claim 9 wherein prior to irradiation said layer of photopolymerizable material has an adhesion to said first carrier sheet which is at least equal to the adhesion of said layer of frangible transferable material to said second carrier sheet, and the strength of the bond between said photopolymerizable material and said frangible material as the result of irradiation is greater than the strength of the adhesion of said frangible transferable material to said second carrier sheet, and further including the step of applying a layer of an adhesive to the portions of said layer of frangible, transferable material remaining on said second carrier sheet after separation of said components, irradiating the portions of said frangible transferable material remaining on said second carrier sheet so as to cause said film of photopolymerizable material to harden and bond to said adhesive, and engaging a selected receptor surface with the adhesive-covered portions of said frangible transferable material remaining on said second carrier sheet, and transferring said remaining portions to said selected receptor surface from said second carrier sheet.

12. The method of claim 8 wherein said layer of frangible transferable material comprises at least one polymer binder and at least one wax.

13. The method of claim 8 wherein said layer of photopolymerizable material is irradiated through said first carrier sheet.

14. The method of claim 13 wherein said first carrier sheet is transparent.

15. A process according to claim 14 wherein said photopolymerizable material comprises an organic polymer binder and a photopolymerizable monomer.

16. A process according to claim 15 wherein said frangible, non-photopolymerizable transferable material comprises a colorant.

17. A process according to claim 15 wherein at least one of said first and second carrier sheets is a sheet of a flexible material.

18. A method of forming and transferring images comprising:
providing a photo-active component and a transferable component, said photo-active component comprising a first carrier sheet coated with a tacky layer of an unexposed photopolymerizable material and said transferable component comprising a layer of a frangible transferable material on a second carrier sheet, said components being disposed so that said photopolymerizable and transferable layers are in contact with one another, irradiating said layer of photopolymerizable material so as to cause selected portions of said photopolymerizable material to harden and bond to confronting portions of said layers of transferable material, separating said components so that the bonded confronting portions of said layer of transferable material separate from said second carrier sheet and a thin film of said photopolymerizable material adheres to said layer of transferable material on said second carrier sheet in areas other than the area of said bonded confronting portions, engaging a selected receptor surface with those portions of said transferable material remaining on said second carrier sheet after separation of said components, and transferring said remaining portions of transferable material to said selected receptor surface from said second carrier sheet by irradiating those remaining portions through said receptor surface so as to cause said film of photopolymerizable material to harden and bond to said receptor surface.

19. A method of forming and transferring images comprising:
providing a photo-active component and a transferable component, said photo-active component comprising a first carrier sheet coated with a tacky layer of an unexposed photopolymerizable material and said transferable component comprising a layer of a frangible transferable material on a second carrier sheet, said layer of photopolymerizable material having an adhesion to said first carrier sheet which is greater than the adhesion of said layer of transferable material to said second carrier sheet, said components being disposed so that said photopolymerizable and transferable layers are in contact with one another, irradiating said layer of photopolymerizable material so as to cause selected portions of said photopolymerizable material to harden and bond to confronting portions of said layer of said transferable material, and separating said components so that the bonded confronting portions of said layer of transferable material separate from said second carrier sheet.

20. A method of forming and transferring images comprising:
providing a photo-active component and a transferable component, said photo-active component comprising a first carrier sheet coated with a tacky layer of an unexposed photopolymerizable material and said transferable component comprising a layer of a frangible transferable material on a second carrier sheet, said layer of photopolymerizable material having an adhesion to said first carrier sheet which is at least equal to the adhesion of said layer of transferable material to said second carrier sheet, said components being disposed so that said photopolymerizable and transferable layers are in contact with one another, irradiating said layer of photopolymerizable material so as to cause selected portions of said photopolymerizable material to harden and bond to confronting portions of said layer of said transferable material with a strength greater than the strength of the adhesion of said layer of transferable material to said second carrier sheet, and separating said components so that the bonded confronting portions of said layer of transferable material separate from said second carrier sheet.

* * * * *